United States Patent
Wu et al.

(10) Patent No.: US 8,696,945 B2
(45) Date of Patent: Apr. 15, 2014

(54) CONDUCTIVE ALUMINUM PASTE AND THE FABRICATION METHOD THEREOF, THE SOLAR CELL AND THE MODULE THEREOF

(75) Inventors: Chun-Min Wu, Taichung (TW); Chu-Lung Chao, Luzhu Township, Taoyuan County (TW); Ying-Chih Lu, Hsinchu (TW); Wen-Jui Huang, Hsinchu (TW)

(73) Assignee: Giga Solar Materials Corporation, Hsinchu (TW)

( * ) Notice: Subject to any disclaimer, the term of this patent is extended or adjusted under 35 U.S.C. 154(b) by 154 days.

(21) Appl. No.: 13/025,630

(22) Filed: Feb. 11, 2011

(65) Prior Publication Data

US 2011/0197961 A1 Aug. 18, 2011

(30) Foreign Application Priority Data

Feb. 12, 2010 (TW) ................................ 99104663 A

(51) Int. Cl.
*H01B 1/02* (2006.01)
*H01B 1/22* (2006.01)

(52) U.S. Cl.
USPC ........................................ 252/512; 252/514

(58) Field of Classification Search
USPC .................................................. 252/512, 514
See application file for complete search history.

(56) References Cited

U.S. PATENT DOCUMENTS

| | | | |
|---|---|---|---|
| 2009/0056798 A1* | 3/2009 | Merchant et al. | 136/256 |
| 2009/0101190 A1* | 4/2009 | Salami et al. | 136/244 |
| 2011/0147678 A1* | 6/2011 | Kim et al. | 252/519.3 |
| 2012/0061624 A1* | 3/2012 | Jung et al. | 252/513 |

* cited by examiner

*Primary Examiner* — Mark Kopec
*Assistant Examiner* — Jaison Thomas
(74) *Attorney, Agent, or Firm* — Muncy, Geissler, Olds & Lowe, P.C.

(57) ABSTRACT

This present disclosure relates to conductive aluminum paste for fabricating a silicon solar cell. Herein, the conductive aluminum paste is composed of organic carrier, aluminum powder, nano-scale metal particle, and glass frit, wherein the nano-scale metal particle has a particle size distribution D50 in the range from 10 nanometers to 1000 nanometers and the weight percentage of the nano-scale metal particle associated with the conductive aluminum paste is around 0.1 through 10 wt %. Furthermore, the characteristics of the conductive aluminum paste are for reducing the sheet resistance value of the electrode, increasing the adhesion in the silicon solar cell package module, and enhancing the electro-optical conversion efficiency of the silicon solar cell.

16 Claims, 3 Drawing Sheets

CONDUCTIVE ALUMINUM PASTE AND THE FABRICATION METHOD THEREOF, THE SOLAR CELL AND THE MODULE THEREOF

BACKGROUND

1. Technical Field

The present disclosure relates to conductive paste, in particular, to the conductive aluminum paste applied in the electro-optic device.

2. Description of Related Art

In recent years, due to the shortage of energy and the importance of environmental protection realized by people, the demand of the pure energy for people is getting bigger and more urgent. Currently, pure energies being most potential comprises the wind power, the water power, the tidal energy, the geothermal power, the biological energy, the energy of the fuel cell, the solar energy, and so on. The most important one of the above pure energies is the solar energy. The solar energy has inexhaustible property, but does not pollute the environment of the earth, therefore being the mainstream of the pure energy.

The semiconductor substrate material of the silicon solar cell is the monocrystalline silicon or the polycrystalline silicon. In recent years, the compound semiconductor or the glass substrate material is developed to be the semiconductor substrate material of the silicon solar cell. The structure of the conventional silicon solar cell is illustrated as follows. A P-type diffused layer and an N-type diffused layer are sequentially formed on the semiconductor substrate, and the P/N junction is therefore formed between the P-type diffused layer and the N-type diffused layer. The energy of the incident light can separate the electron and the hole of the electron-hole pair in the P/N junction. The ohmic contacts (i.e. conductive metal sheets) are respectively formed on the P-type diffused layer and the N-type diffused layers, wherein the ohmic contacts are served as the electrodes of the silicon solar cell. The electrodes are used to conduct the electrons and the holes of the electron-hole pairs being separated to the external of the semiconductor substrate, and the process of the conversion which the light energy is converted to the electrical power is therefore finished.

Regarding the general fabrication of the silicon solar cell, the diffusion of the phosphorus atoms and the boron atoms are used to fabricate the N-type diffused layer and the P-type diffused layer, such that the P/N junction is formed. Moreover, the specific surface process is used to form an anti-reflection layer with the texture structure, such that the reflection of the incident light is reduced, and the strength of the incident light is also increased.

The electrodes of the conventional silicon solar cell are usually formed on the two sides of the semiconductor substrate by using the screen printing manner, the smearing manner, or the vacuum coating manner, and that is, the two electrodes are respectively a light incident side electrode and a back side electrode, wherein the light incident side electrode comprises a bus electrode and a finger electrode. The bus electrode and the finger electrode (i.e. the light incident electrode) are usually made of the silver paste. The area of incident light is increased to enhance the electro-optic conversion efficiency, and due to the requirement for increasing the area of incident light, the surface area of the light incident side electrode must be reduced. In other words, to increase the area of the incident light, the surface area of the light incident side electrode is designed to be small as possible. The back side electrode can be located on the entire back side of the semiconductor substrate since the light does not illuminate the back side (or the back side electrode) of the semiconductor substrate. Since the light does not illuminate the back side of the semiconductor substrate, the back side electrode is usually made of the silver-aluminum paste and the aluminum paste. After the light incident side electrode and the back side electrode are smearing on the two sides of the semiconductor substrate, the sintering process is then performed. In the sintering process, the high temperature (usually in the range from 600 degrees centigrade to 1000 degrees centigrade) is used to sinter the semiconductor substrate which the light incident side electrode and the back side electrode are smearing on the two sides, such that the aluminum atoms in the aluminum paste are diffusing into the P-type semiconductor (P-type diffused layer) to form the P+ layer. Therefore, the value of the open circuit voltage Voc in the circuit is increased, and the back side surface field (BSF) is also generated to enhance the electro-optical conversion efficiency of the silicon solar cell. It is noted that, the ohmic contact between each electrode and the semiconductor substrate must be maintained well, and the resistance value of the ohmic contact must also be maintained low, such that the electro-optical conversion efficiency of the silicon solar cell the electro-optical conversion efficiency of the silicon solar cell can be enhanced.

The electrode affects the stability of the electro-optical conversion efficiency of the silicon solar cell much. The usual standard value for evaluating the performance of the electrode is the fill factor (FF) of the silicon solar cell. If the resistance value of the serially connected resistors changes to be higher, the fill factor of the silicon solar cell will change to be smaller. The serially connected resistors are formed by the resistor of the ohmic contact between the P-type diffused layer and the electrode, the resistor between the P-type diffused layer and the electrode (i.e. ohmic contact), the resistor between the N-type diffused layer and the other one electrode, and the resistors of the electrodes.

Hence, to obtain the higher electro-optical conversion efficiency and the higher stability, some people are dedicated to the improvement of the fabrication material of the electrodes.

SUMMARY

An exemplary embodiment of the present disclosure provides conductive aluminum paste, wherein composition of the conductive aluminum paste comprises organic carrier, aluminum powder, glass frit, and nano-scale metal particle. The organic carrier, the aluminum powder, the glass frit, and the nano-scale metal particle are mixed to form the conductive aluminum paste, and addition of the nano-scale metal particle is used to reduce a sheet resistance value of the conductive aluminum paste, and to increase adhesion of the conductive aluminum paste. The organic carrier is composed of organic solvent, resin, and thixotropic agent.

An exemplary example of the present disclosure provides a method for fabricating conductive aluminum paste. Organic solvent, resin, and thixotropic agent are mixed to form organic carrier. Aluminum powder, nano-scale metal particle, glass frit, and the organic carrier are mixed to form the conductive aluminum paste.

An exemplary embodiment of the present disclosure provides a silicon solar cell module. The silicon solar cell module comprises a substrate, a covering plate, and a silicon solar cell. The covering plate is located on the substrate. The silicon solar cell is covered with ethylene vinyl acetate (EVA) material, and located between the substrate and the covering plate. The silicon solar cell has a light incident side electrode and a back side electrode, and the back side electrode is made of conductive aluminum paste, and the conductive aluminum paste has nano-scale metal particle mixed therein.

To sum up, the conductive aluminum paste provided by the exemplary embodiment of the present disclosure has nano-scale metal particle added therein, and the conductive aluminum paste is used to form the silicon solar cell, so as to increase the electro-optical conversion efficiency of the silicon solar cell.

In order to further understand the techniques, means and effects the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

DESCRIPTION OF THE EXEMPLARY EMBODIMENTS

[Exemplary Embodiment of Silicon Solar Cell]

Figure 1:
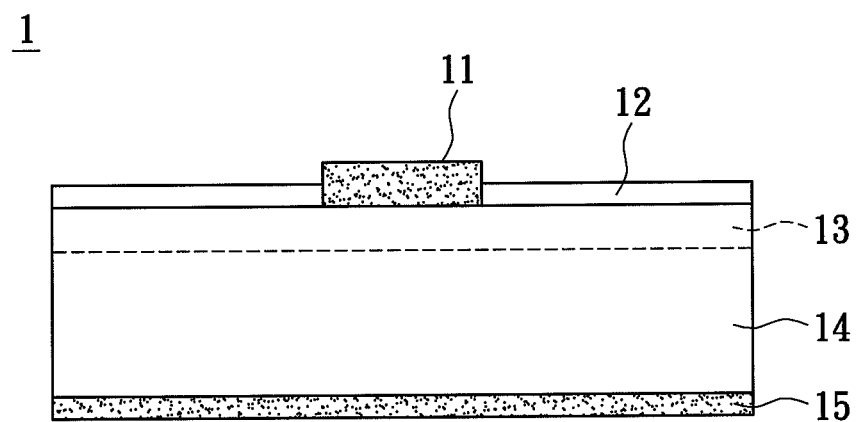
FIG. 1 is a cross-sectional view of the structure of the silicon solar cell according to one exemplary embodiment of the present disclosure.

Referring to FIG. 1, FIG. 1 is a cross-sectional view of the structure of the silicon solar cell according to one exemplary embodiment of the present disclosure.

The silicon solar cell 1 is a semiconductor substrate having a N-type diffused layer 13 and a P-type diffused layer 14 formed thereon, wherein the N-type diffused layer 13 is located on the P-type diffused layer 14. The N-type diffused layer 13 and the P-type diffused layer 14 are contacted with each other, and the P/N junction is therefore naturally generated on the boundary between the N-type diffused layer 13 and the P-type diffused layer 14.

The light incident side of the silicon solar cell 1 in the exemplary embodiment is the surface of the N-type diffused layer 13. Furthermore, an anti-anti-reflection layer 12 located on can contacted with the N-type diffused layer 13 is made of by silicon nitride (SiN) usually. The anti-reflection layer 12 is able to reduce the reflection of the incident light. The anti-reflection layer 12 can further have the functions of the protection and surface deactivation, such that the silicon solar cell 1 can resist against the abrasion and the moisture. A texture process is further performed on the surface of the anti-reflection layer 12, such that a plurality of big and small pyramid structures are formed on the surface of the anti-reflection layer 12. Accordingly, the incident light to be reflected outside the chip surface of the silicon solar cell 1 must be reflected at least twice, and the possibility that the incident light to be reflected outside the chip surface of the silicon solar cell 1 reflects merely once is reduced. Since the reflection of the incident light of the light incident surface is reduced, the electro-optical conversion efficiency of the silicon solar cell 1 is enhanced.

After the processes for performing the N-type diffused layer 13, the P-type diffused layer 14, and the anti-reflection layer 12 on the semiconductor substrate are finished, the electrodes used to connect the silicon solar cell 1 and the external circuit must be manufactured in the silicon solar cell 1. The electrodes of the silicon solar cell 1 can conduct the electrons and the holes of the electron-hole pairs separated by the electron-optical conversion effect due to the incident light to the external of the silicon solar cell 1. Generally speaking, the silicon solar cell 1 has two parallel strip electrodes respectively on the surfaces of the lightproof side and the light incident side of the semiconductor substrate, wherein the two parallel strip electrodes are welding places provided to connect to the external of the silicon solar cell 1. A layer of a back side electrode 15 is usually formed on the lightproof side of the semiconductor substrate. The back side electrode 15 further usually covers the entire the lightproof side of the semiconductor substrate, so as to generate the so-called back surface field (BSF) electrode layer. By contrast, a layer of a light incident side electrode 11 is formed on the surface of the light incident side of the semiconductor substrate. The light incident side electrode 11 comprises a bus electrode and a finger electrode, wherein the bus electrode and the finger electrode have an ultra small linewidth therebetween, so as to avoid the reduction of the incident area of the incident light due to the shielding of the light incident side electrode 11.

The layer of the back side electrode 15 can increase the collection of the carriers, and further can recycle the photons not being absorbed. Since the light incident side electrode 11 usually shields the 3% through 5% of the incident light, the light incident side electrode 11 is designed to comprise the bus electrode and the finger electrode. The light incident side electrode 11 is designed not only to collect the carrier efficiently, but also to reduce the shielding percentage of the incident light due to the light incident side electrode 11. The light incident side electrode 11 is usually made of the silver paste of the conductive aluminum paste, and the back side electrode 15 is usually made of the silver paste of the aluminum paste, the aluminum paste of the conductive aluminum paste, or the both of the silver paste and the conductive paste of the conductive aluminum paste. The screen printing manner is used to fabricate the bus electrode and the finger electrode on the light incident side of the silicon solar cell 1, wherein the bus electrode and the finger electrode have an ultra small linewidth therebetween, so as to avoid the reduction of the incident area of the incident light due to the shielding of the light incident side electrode 11.

After the light incident side electrode 11 and the back side electrode 15 are respectively formed on the light incident side and the lightproof side (i.e. back side) of the semiconductor substrate, the sintering process is then performed, wherein in the sintering process, the sintering temperature is 680 through 850 degrees centigrade. In the exemplary embodiment, the conveyor belt transmission is used to perform the sintering process, wherein the speed of the conveyor belt is 4 through 6 meters per minute, and the thickness of the formed electrodes are 30 through 50 micrometers. After the sintering process is performed, the organic solvent in the conductive aluminum paste of the light incident side electrode 11 and the back side electrode 15 is therefore evaporated, and the aluminum atoms in the aluminum powder of the back side electrode 15 are diffused into the semiconductor substrate, such that the generated back side surface field (BSF) has the better efficiency for increasing the electro-optical conversion efficiency of the silicon solar cell 1.

Due to the low electro-optical conversion efficiency of the single silicon solar cell 1, the process and the material characteristics of the light incident side electrode 11 and the back side electrode 15 is therefore become important, wherein the light incident side electrode 11 and the back side electrode 15 are served as the electrodes of the silicon solar cell 1. The small difference of the parameters, such as the sheet resistance value, the current value, the voltage value, the resistance value of the ohmic contact, and so on, of the light incident side electrode 11 and the back side electrode 15 affect the electro-optical conversion efficiency of the single silicon solar cell 1 very much. Accordingly, the exemplary embodiment provides conductive aluminum paste to efficiently increase electro-optical conversion efficiency of the single silicon solar cell. The above light incident side electrode 11 and the above back side electrode 15 is made of the conductive aluminum paste provided by the exemplary embodiment.

[Exemplary Embodiment of Method for Fabricating Conductive Aluminum Paste]

Figure 2:
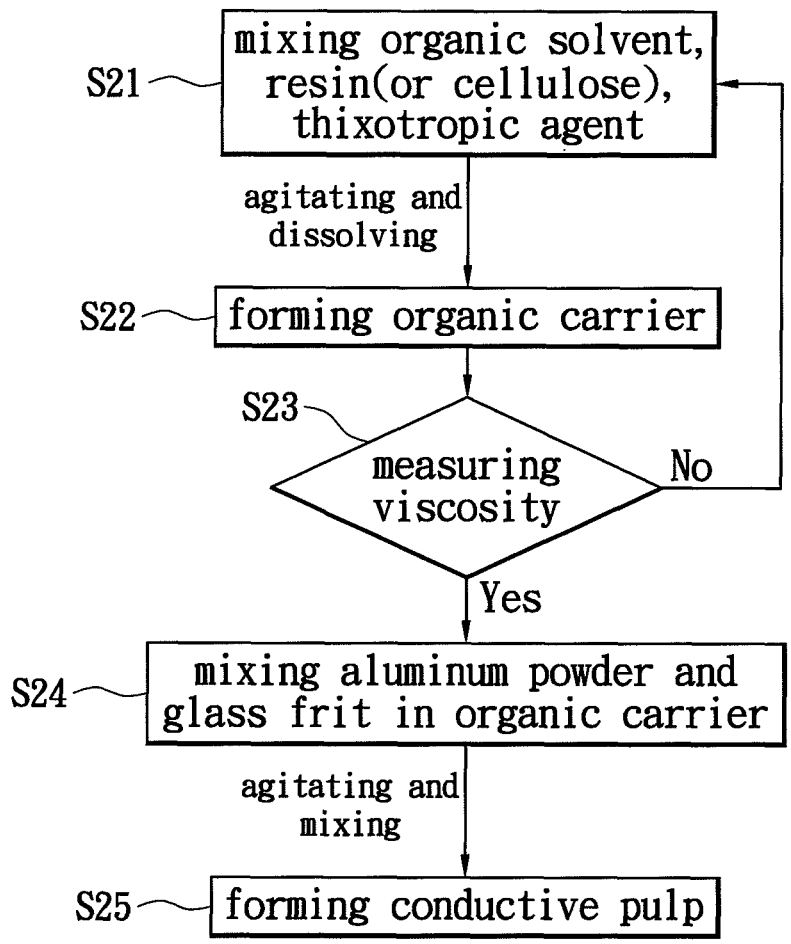
FIG. 2 is flow chart showing a method for fabricating conductive aluminum paste according to one exemplary embodiment of the present disclosure.

Referring to FIG. 2, FIG. 2 is flow chart showing a method for fabricating conductive aluminum paste according to one exemplary embodiment of the present disclosure. The conductive aluminum paste can be used to fabricate the silicon solar cell and the module thereof, but the application of the conductive aluminum paste is not limited thereto. The conductive aluminum paste is used to fabricate the electro-optical devices of the other kinds, so as to increase the electro-optical conversion efficiency of the electro-optical devices.

The conductive aluminum paste provided by the exemplary embodiment is mixed with and composed of the organic solvent, the resin (or the cellulose), the thixotropic agent, the aluminum powder, the nano-scale metal particle, and the glass fit. Referring to Table 1, the weight percentage of the organic solvent associated with the conductive aluminum paste is around 15 through 25 wt %. The weight percentage of the resin (or the cellulose) associated with the conductive aluminum paste is around 1 through 3 wt %. The weight percentage of the thixotropic agent with the conductive aluminum paste is around 0.2 through 0.5 wt %. The weight percentage of the aluminum powder associated with the conductive aluminum paste is around 65 through 85 wt %. The weight percentage of the nano-scale metal particle associated with the conductive aluminum paste is around 0.1 through 10 wt %. The weight percentage of the glass frit associated with the conductive aluminum paste is around 0.1 through 6 wt %. The weight percentage of the nano-scale metal particle associated with the conductive aluminum paste is less than 10 wt %, and the preferred weight percentage of the nano-scale metal particle associated with the conductive aluminum paste is 2 wt %. In the exemplary embodiment, the nano-scale metal particle is the nano-scale silver particle. Furthermore, the silver powder is used to replace the aluminum powder to form the above silver paste of the conductive aluminum paste.

Table 1 shows the weight percentage of each ingredient of conductive aluminum paste according to one exemplary of the present disclosure.

| Ingredient | weight percentage (wt %) |
| --- | --- |
| the resin (or the cellulose) | 1-3 |
| the organic solvent | 15-25 |
| thixotropic agent | 0.2-0.5 |
| aluminum powder | 65-85 |
| nano-scale metal particle | 0.1-10 |
| glass frit | 0.1-6 |

In the exemplary embodiment, the organic solvent is the organic solvent of the alcohol ether class or the other organic solvent. The organic solvent of the alcohol ether class is diethylene glycol monobutyl ether. The resin (or the cellulose) is ethyl cellulose or the other resin or cellulose material. The thixotropic agent is hydrogenated castor oil or the other thixotropic agent material. The nano-scale metal particle is gold, silver, copper, zinc and lead metal. Referring to Table 2, the glass frit can be selected from the glass frit of lead compound, such as PbO—B2O3-SiO2, and the other glass fit. The material of each ingredient is used to illustrate conductive aluminum according to the exemplary example of the present disclosure, and the material of each ingredient is not used to limit the present disclosure. The nano-scale metal particle has a particle size distribution D50 in the range from 10 nanometers to 1000 nanometers (i.e. the 50% nano-scale metal particle having the particle size larger than the specific value, and the specific value is in the range from 10 nanometers to 1000 nanometers), and the preferred particle size distribution D50 of the nano-scale metal particle is 30 nanometers (i.e. the 50% nano-scale metal particle having the particle size larger than the specific value, and the specific value is 30 nanometers).

Table 2 shows the compositions of the glass frit kind of different kinds in the conductive aluminum paste.

| composition |
| --- |
| PbO—SiO2—B2O3—Al2O3 |
| SiO2—PbO—B2O3—Al2O3—ZrO2 |
| Bi2O3—ZnO—SiO2—B2O3—Al2O3 |
| SiO2—SrO—Bi2O3—B2O3—Al2O3 |
| SiO2—PbO—ZnO—B2O3—Al2O3—TiO2 |
| SiO2—PbO—ZnO—B2O3—Al2O3 |
| SiO2—Bi2O3—B2O3—Al2O3—Tl—ZnO |
| PbO—B2O3—SiO2 |

In step S21, the organic solvent, the resin (or the cellulose), the thixotropic agent of the conductive aluminum paste is firstly mixed, agitated, and dissolved, such that the above materials are uniformly mixed. In step S22, the weight percentages of the above materials associated with the conductive aluminum paste are properly adjusted, so as to form organic carrier. Next, in step S23, viscosity of the organic carrier is measured to promise the conductive aluminum paste according to the exemplary embodiment have a best viscosity, such that the other related processes of the conductive aluminum paste are operated in coordination well, and adhesion effect is adjusted correspondingly. Next, in step S24, the nano-scale metal particle, such as the aluminum powder, and the glass frit are mixed in the organic carrier. In step S25, after carefully agitating and mixing the ingredients of the conductive aluminum paste, the conductive pulp of the conductive aluminum paste according to the exemplary embodiment is therefore generated.

As the silicon solar cell shown in FIG. 1, the back side electrode 15 is made of the conductive aluminum paste according to the exemplary embodiment, and the printing manner or the smearing manner can be used to form the back side electrode 15 on the lightproof side (i.e. the back side in the exemplary embodiment) of the silicon solar cell 1. Then the sintering temperature being 680 through 850 degrees centigrade in the sintering process is used to make the aluminum atoms of the back side electrode 15 diffuse into the semiconductor substrate, such that the back side surface field is generated, and the electro-optical conversion efficiency of the silicon solar cell is increased.

[Exemplary Embodiment of Silicon Solar Cell Module]

Figure 3A:
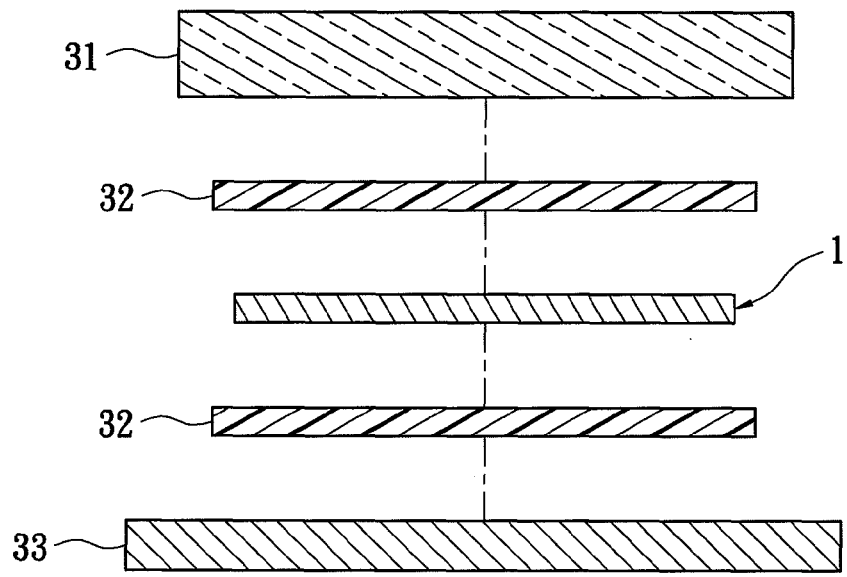
FIG. 3A is an explosive diagram of the package module of the silicon solar cell according to one exemplary embodiment of the present disclosure.
Figure 3B:
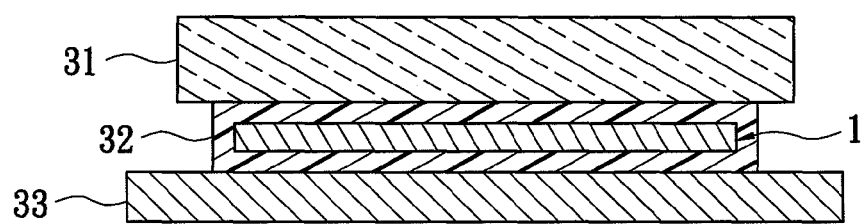
FIG. 3B is cross-sectional view of the structure of the package module of the silicon solar cell according to one exemplary embodiment of the present disclosure.

Referring to FIG. 3A and FIG. 3B, FIG. 3A is an explosive diagram of the package module of the silicon solar cell according to one exemplary embodiment of the present disclosure, and FIG. 3B is cross-sectional view of the structure of the package module of the silicon solar cell according to one exemplary embodiment of the present disclosure.

In the package process of the silicon solar cell module 2, due to the low output electrical power of the single silicon solar cell 1, several ten silicon solar cells 1 are serially connected or parallel connected, so as to output the sufficient electrical power. The silicon solar cell module 2 is usually located in the outdoor environment, and to protect the silicon solar cell 1 against from the mechanical stress, sun exposure, and the moisture, the several ten silicon solar cells 1 being serially connected or parallel connected are embedded into transparent package material. The transparent package material can insulate the silicon solar cell 1, and can further have the functions for resisting against the ultraviolet, the moisture, and the mechanical collision.

Regarding the stability and the reliability of the structure, a covering plate 31 is covered on the silicon solar cell 1 so as to perform the package of the silicon solar cell module 2. The covering plate 31 is the general glass or the tempered glass, or the covering plate 31 is an acrylic fabric board, a sheet metal, or a thin plastic plate. In the exemplary embodiment, the covering plate 31 is the glass. It is important that the covering object located on light incident side of silicon solar cell 1 should be made of the transparent material. When the covering object is made of the more transparent material, the more incident light is projected on the silicon solar cell 1. Based upon the reason, the low-valence iron glass is usually used to fabricate the covering plate 31, because 91% incident light can pass through the low-valence iron glass. This glass is processed by the tempering process, such that the property of the glass for resisting against the high temperature is enhanced. In addition, a novel anti-reflection glass being processed by the melting process or the dipping process has the anti-reflection smearing layer, such that 96% incident light can pass through this anti-reflection glass. Therefore, the anti-reflection glass can be further used to fabricate the covering plate 31 of the silicon solar cell module 2. The silicon solar cell module using this anti-reflection glass can have more 3.5% absorption energy than that using this general glass.

Next, two layers of EVA material 32 are formed under the covering plate 31, and the two layers of EVA material 32 are respectively on the top and bottom sides of the silicon solar cell 1. The EVA material 32 is the plastic material with the thermoplasticity and the transparent property, and can be melted into a liquid with the specific viscosity under the higher temperature condition. The liquid of the EVA material 32 can be restored into the solid state under the normal temperature, and the EVA material 32 of the solid state has the property for resisting the ultraviolet, such that the EVA material 32 is suitable for packing the silicon solar cell 1. In addition, the non-transparent substrate 33 is located at the bottom side of the, and the entire silicon solar cell module 2 is therefore assembled. The non-transparent substrate 33 is the metal substrate, the glass substrate, the plastic substrate, or the substrate of the other kind. The non-transparent substrate 33 is further a combination of the transparent substrate and the non-transparent substrate. The non-transparent substrate 33 is used to support the silicon solar cell 1.

Finally, after the covering plate 31, the EVA material 32, the silicon solar cell 1, and the non-transparent substrate 33 are aligned and stacked, the EVA material 32 is melted in the high temperature and high pressure process in the vacuum environment, so as to pack the entire silicon solar cell 1, and to complete the package of the silicon solar cell module 2. The silicon solar cell module 2 after the package is completed can have the properties for resisting against the mechanical stress, the sun exposure, and the moisture. Accordingly, the silicon solar cell module 2 has the good stability and reliability, and is suitable for the application and setup of the outdoor environment.

The performance of silicon solar cell 1 depends on the electro-optical conversion efficiency, and the factors affects the electro-optical conversion efficiency comprises the strength of the incident light, the incident angle of the incident light, the environmental temperature, the sheet resistance values of the light incident side electrode 11 and the back side electrode 15, the linewidths, the lineheights, the resistance values of the ohmic contacts, the quality of the semiconductor substrate of the silicon solar cell, the concentrations of the P-type diffused layer and the N-type diffused layer, the anti-reflection ratio of the surface of the anti-reflection layer 12, and so on. Each of the above factors severely affects the electro-optical conversion efficiency. Regarding the effect due to the sheet resistance value of the silicon solar cell 1, the adhesion of the semiconductor substrate, and the warp degree, the exemplary embodiment provides a conductive aluminum paste having the new ingredients to form the back side electrode 15.

The conductive aluminum paste generated according to above fabricating steps and the ingredients is grouped into the reference example and the first and second compared examples to be measured. The composition ratio and the ingredients of the conductive aluminum are shown in Table 3. The difference between the first and the second compared examples is that the weight percentages of the aluminum powder and the nano-scale metal particle associated with the conductive aluminum paste are not identical. The reference example is the conductive aluminum paste composed of the conventional ingredients, and the nano-scale metal particle is not added therein. In the first compared example, the 1 wt % nano-scale metal particle is added in the conductive aluminum paste, and the conductive aluminum paste has the less 1 wt % aluminum powder than that of the conductive aluminum paste in the reference example. In the second compared example, the 2 wt % nano-scale metal particle is added in the conductive aluminum paste, and the conductive aluminum paste has the less 2 wt % aluminum powder than that of the conductive aluminum paste in the reference example. In the exemplary embodiment, the conductive aluminum paste having different weight percentages of the nano-scale metal particle in the first and second compared examples are used to compared to the conventional conductive aluminum paste of the reference example. The difference of the measured data between the conventional conductive aluminum paste and the conductive aluminum past having the nano-scale metal particle added therein according to the exemplary embodiment is obviously shown.

Table 3 shows the composition of the ingredients of the conductive aluminum paste in the first and second compared examples and the reference example.

| composition of ingredient of conductive aluminum paste | reference example | first compared example | second compared example |
|---|---|---|---|
| organic carrier (wt %) | 24 | 24 | 24 |
| aluminum powder (wt %) | 72 | 71 | 70 |
| glass frit (wt %) | 4 | 4 | 4 |
| nano-scale metal particle (wt %) | 0 | 1 | 2 |

The measured data of the reference example, the first and second compared examples are shown in the Table 4. The electro-optical efficiencies of the silicon solar cell in the reference example, the first and second compared examples are respectively 16.4343%, 16.5142% and 16.4465%. Accordingly, the conductive aluminum paste provided by the exemplary embodiment can be used to form the silicon solar cell, so as to increase the electro-optical conversion efficiency of the silicon solar cell. The sheet resistance values in the reference example, the first and second compared examples are respectively 1.58 through 2.22 ohms, 1.33 through 1.63 ohms, and 1.15 through 1.52 ohm. It is known that the conductive aluminum paste provided by the exemplary embodiment has the lower sheet resistance value than that of the conductive aluminum paste having the conventional ingredients, and therefore the attenuation of the power energy during the transmission is reduced dramatically.

Due the low output electrical power of the single silicon solar cell 1, several silicon solar cells are serially or parallel connected to form the silicon solar cell module 2. These silicon solar cells 1 are welding to be connected, and therefore adhesion of the back side electrode 15 made of conductive aluminum paste and the substrate of the silicon solar cell 1 becomes important. If adhesion of the back side electrode 15 made of conductive aluminum paste and the substrate of the silicon solar cell 1 is not good, the generated voltage or current on the back side electrode 15 will be not stable. In the severely worse case, the electrode is stripped, and the silicon solar cell module 2 is opened and broken off. As shown in Table 4, the adhesion in the reference example, the first and second compared examples are respectively stress forces of at least 3N/cm, 3N/cm, and 5N/cm. It is known that the conductive aluminum paste having 2 wt % nano-scale metal particle has the better adhesion than that of the conductive aluminum paste using the conventional ingredients.

Since the back side electrode 15 is formed on the lightproof side of the silicon solar cell 1, and the expanding coefficients of the conductive aluminum paste and the semiconductor substrate are not the same, the warp of the semiconductor substrate occurs after the sintering process is performed. If the back side electrode 15 made of conductive aluminum paste causes the warp of the silicon solar cell 1, after the package process of the silicon solar cell module 2 is performed, the fault problem of the silicon solar cell module 2 occurs according to the warp of the silicon solar cell 1, and the yield rate is affected. From Table 4, it is known that the warp corresponding to the conductive aluminum paste having the 1 wt % nano-scale metal particle or 2 wt % nano-scale metal particle is similar to the warp corresponding to the conductive aluminum paste having the conventional ingredients. Accordingly, the conductive aluminum paste according to the exemplary embodiment does not make the severe warp of the silicon solar cell 1, and at least maintain the same warp corresponding to the conductive aluminum paste having conventional ingredients, such that the yield rate of the package process of the silicon solar cell module 2 is not affected.

Table 4 shows the measured data of the reference example, the first and second compared examples.

| example | conversion efficiency (η %) | open circuit voltage Voc(V) | sheet resistance value (mΩ) | adhension (N/cm) | warp (mm) |
|---|---|---|---|---|---|
| reference example | 16.4343 | 0.621487 | 1.58-2.22 | 3-5 | <1 |
| first compared example | 16.5142 | 0.62203 | 1.33-1.63 | 3-5 | <1 |
| second compared example | 16.4465 | 0.62098 | 1.15-1.52 | >5 | <1 |

[Possible Result of Exemplary Embodiment]

Accordingly, the conductive aluminum paste according to the exemplary embodiment has the nano-scale metal particle of the specific ratio added therein, and the conductive aluminum paste according to the exemplary embodiment has the low sheet resistance value, the high adhesion and the low warp of the semiconductor substrate. The electro-optical conversion efficiency of the silicon solar cell 1 formed by conductive aluminum paste according to the exemplary embodiment is increased, and the package stability and the yield rate of silicon solar cell module 2 are also increased.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A conductive aluminum past comprising:
   an organic carrier, being composed of organic solvent, resin, and thixotropic agent;
   an aluminum powder;
   a glass frit; and
   a nano-scale metal, selecting from gold, silver, copper, zinc, lead, or any combination thereof,
   wherein a weight percentage of the nano-scale metal associated with the conductive aluminum paste is around 0.1 through 10 wt %,
   wherein a particle size distribution D50 of the nano-scale metal is in the range from 10 nanometers to 300 nanometers,
   wherein the organic carrier, the aluminum powder, the glass frit, and the nano-scale metal are mixed to form the conductive aluminum paste, and addition of the nano-scale metal is used to reduce a sheet resistance value of the conductive aluminum paste, and to increase adhesion of the conductive aluminum paste.

2. The conductive aluminum paste according to claim 1, wherein a weight percentage of the aluminum powder associated with the conductive aluminum paste is around 65 through 85 wt %.

3. The conductive aluminum paste according to claim 1, wherein the organic solvent is an alcohol ether class solvent, and a weight percentage of the organic solvent associated with the conductive aluminum paste is around 15 through 25 wt %.

4. The conductive aluminum paste according to claim 1, wherein the glass frit is selected from a lead compound, and a weight percentage of the glass frit associated with the conductive aluminum paste is around 0.1 through 6 wt %.

5. The conductive aluminum paste according to claim 1, wherein the nano-scale metal has a preferred particle size distribution D50 being about 30 nanometers.

6. The conductive aluminum paste according to claim 1, wherein a preferred weight percentage of the nano-scale metal associated with the conductive aluminum paste is 2 wt %.

7. The conductive aluminum paste according to claim 1, wherein the aluminum powder is further a mixture comprising a silver powder.

8. The conductive aluminum paste according to claim 1, wherein a weight percentage of the thixotropic agent associated with the conductive aluminum paste is around 0.2 through 0.5 wt %.

9. The conductive aluminum paste according to claim 1, wherein a weight percentage of the resin associated with the conductive aluminum paste is around 1 through 3 wt %.

10. The conductive aluminum paste according to claim 1, wherein the alcohol ether class solvent is diethylene glycol monobutyl ether.

11. A method for fabricating conductive aluminum paste, comprising:
    mixing an organic solvent, a resin, and a thixotropic agent to form an organic carrier; and
    mixing an aluminum powder, a nano-scale metal, a glass frit, and the organic carrier to form the conductive aluminum paste,
    wherein the nano-scale metal is selected from gold, silver, copper, zinc, lead, or any combination thereof,
    wherein a particle size distribution D50 of the nano-scale metal is in the range from 10 nanometers to 300 nanometers,
    wherein a weight percentage of the nano-scale metal associated with the conductive aluminum paste is around 0.1 through 10 wt %,
    wherein the organic carrier, the aluminum powder, the glass frit, and the nano-scale metal are mixed to form the conductive aluminum paste, and addition of the nano-scale metal is used to reduce a sheet resistance value of the conductive aluminum paste, and to increase adhesion of the conductive aluminum paste.

12. The method for fabricating conductive aluminum paste according to claim 11,
    wherein a weight percentage of the aluminum powder associated with the conductive aluminum paste is around 65 through 85 wt %,
    wherein the organic solvent is an alcohol ether class solvent, and a weight percentage of the organic solvent associated with the conductive aluminum paste is around 15 through 25 wt %,
    wherein the glass frit is selected from the glass frit of lead compound, and a weight percentage of the glass frit associated with the conductive aluminum paste is around 0.1 through 6 wt %.

13. The method for fabricating conductive aluminum paste according to claim 12, wherein the alcohol ether class solvent is diethylene glycol monobutyl ether.

14. The method for fabricating conductive aluminum paste according to claim 11, wherein the aluminum powder is further a mixture comprising a silver powder.

15. The method for fabricating conductive aluminum paste according to claim 11, wherein the nano-scale metal has a preferred particle size distribution D50 being about 30 nanometers.

16. The method for fabricating conductive aluminum paste according to claim 11, wherein a preferred weight percentage of the nano-scale metal associated with the conductive aluminum paste is 2 wt %.

\* \* \* \* \*